(12) United States Patent
Pixley et al.

(10) Patent No.: US 12,315,658 B2
(45) Date of Patent: May 27, 2025

(54) CONTROLLING A QUANTUM POINT JUNCTION ON THE SURFACE OF AN ANTIFERROMAGNETIC TOPOLOGICAL INSULATOR

(71) Applicant: Rutgers, The State University of New Jersey, New Brunswick, NJ (US)

(72) Inventors: Jedediah Pixley, Highland Park, NJ (US); Nicodemos Varnava, Highland Park, NJ (US); David Vanderbilt, Princeton, NJ (US); Justin Wilson, Highland Park, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 510 days.

(21) Appl. No.: 17/690,627

(22) Filed: Mar. 9, 2022

(65) Prior Publication Data

US 2022/0367090 A1 Nov. 17, 2022

Related U.S. Application Data

(60) Provisional application No. 63/158,549, filed on Mar. 9, 2021.

(51) Int. Cl.
| | | |
|---|---|---|
| *H01F 1/00* | (2006.01) |
| *B82Y 10/00* | (2011.01) |
| *B82Y 20/00* | (2011.01) |
| *B82Y 25/00* | (2011.01) |
| *G01R 33/07* | (2006.01) |
| *G02F 1/21* | (2006.01) |
| *H10N 52/00* | (2023.01) |
| *H10N 52/01* | (2023.01) |
| *H10N 52/80* | (2023.01) |
| *H10N 52/85* | (2023.01) |

(52) U.S. Cl.
CPC ......... *H01F 1/0072* (2013.01); *G01R 33/072* (2013.01); *G02F 1/212* (2021.01); *H10N 52/00* (2023.02); *H10N 52/01* (2023.02); *H10N 52/80* (2023.02); *H10N 52/85* (2023.02); *B82Y 10/00* (2013.01); *B82Y 20/00* (2013.01); *B82Y 25/00* (2013.01)

(58) Field of Classification Search
CPC ........ H10N 50/85; H10N 52/00; H10N 52/80; H01F 10/002
See application file for complete search history.

(56) References Cited

U.S. PATENT DOCUMENTS 9,865,713 B2    1/2018  Habib et al.

OTHER PUBLICATIONS

Shuai Li, Tianyu Liu, Chang Liu, Yayu Wang, Hai-Zhou Lu, X C Xie, Progress on the antiferromagnetic topological insulator MnBi2Te4, National Science Review, vol. 11, Issue 2, Feb. 2024, nwac296, https://doi.org/10.1093/nsr/nwac296 (Year: 2023).*

(Continued)

*Primary Examiner* — William F Kraig
(74) *Attorney, Agent, or Firm* — MEAGHER EMANUEL LAKS GOLDBERG & LIAO, LLP

(57) ABSTRACT

Various embodiments include an electrical device comprising an antiferromagnetic topological insulator having a surface comprising a bulk domain wall configured to support a first type of 1D chiral channel, a surface step configured to support a second 1D chiral channel and intersecting the bulk domain wall to form thereat a quantum point junction.

20 Claims, 11 Drawing Sheets

(56) References Cited

OTHER PUBLICATIONS

Varnava N, Wilson JH, Pixley JH, Vanderbilt D. Controllable quantum point junction on the surface of an antiferromagnetic topological insulator. Nat Commun. Jun. 28, 2021;12(1):3998. doi: 10.1038/s41467-021-24276-5. PMID: 34183668; PMCID: PMC8238970. (Year: 2021).*

Li et al., "Antiferromagnetic topological insulator MnBi2Te4: synthesis and magnetic properties", Phys. Chem. Chem. Phys., vol. , No. 2, pp. 556-563, Jan. 2, 2020.

Otrokov et al.. "Prediction and observation of an antiferromagnetic topological insulator", Nature, vol. 576, pp. 416-422 (2020.

Sass et al. "Robust A-type order and spin-flop transition on the surface of the antiferromagnetic topological insulator MnBi2Te4", arXiv:2006.07656, Jun. 13, 2020.

* cited by examiner

CONTROLLING A QUANTUM POINT JUNCTION ON THE SURFACE OF AN ANTIFERROMAGNETIC TOPOLOGICAL INSULATOR

CROSS-REFERENCE TO RELATED APPLICATION

This application claims priority to U.S. Provisional Patent Application No. 63/158,549 filed on Mar. 9, 2021 entitled CONTROLLING A QUANTUM POINT JUNCTION ON THE SURFACE OF AN ANTIFERROMAGNETIC TOPOLOGICAL INSULATOR, which application is incorporated herein by reference in its entirety.

STATEMENT OF RIGHTS TO INVENTIONS MADE UNDER FEDERALLY SPONSORED RESEARCH

This invention was made with government support under Grant No. DMR-1941569, Grant No. DMR-1408838 and Grant No. DMR-1954856 awarded by the National Science Foundation. The government has certain rights in the invention.

FIELD OF THE DISCLOSURE

The present disclosure generally relates to the generation and manipulation of the quantum point junctions on the surface of antiferromagnetic topological insulators.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Surface and edge-state engineering of topological materials offers great promise for future electronic devices. Owing to the topological properties of the bulk of the material, surface states emerge that are protected from elastic and inelastic scattering. In particular topologically-protected chiral (one-way) or helical (2-way) edge states provide dissipation-less "quantum wires" with potential applications in sensor, low-power computing, and quantum information technologies. A crucial part of engineering such wires requires robust and tunable junctions between edge states.

SUMMARY

Various deficiencies in the prior art are addressed by systems, methods, architectures, mechanisms and apparatus for the generation and manipulation of the quantum point junctions on the surface of antiferromagnetic topological insulators, such as by intersecting domain wall and step channels.

Various embodiments provide an electrical device comprising an antiferromagnetic topological insulator having a surface with a bulk domain wall configured to support a first type of 1D chiral channel, a surface step configured to support a second 1D chiral channel and intersecting the bulk domain wall to form thereat a quantum point junction.

Additional objects, advantages, and novel features of the invention will be set forth in part in the description which follows, and will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1A:
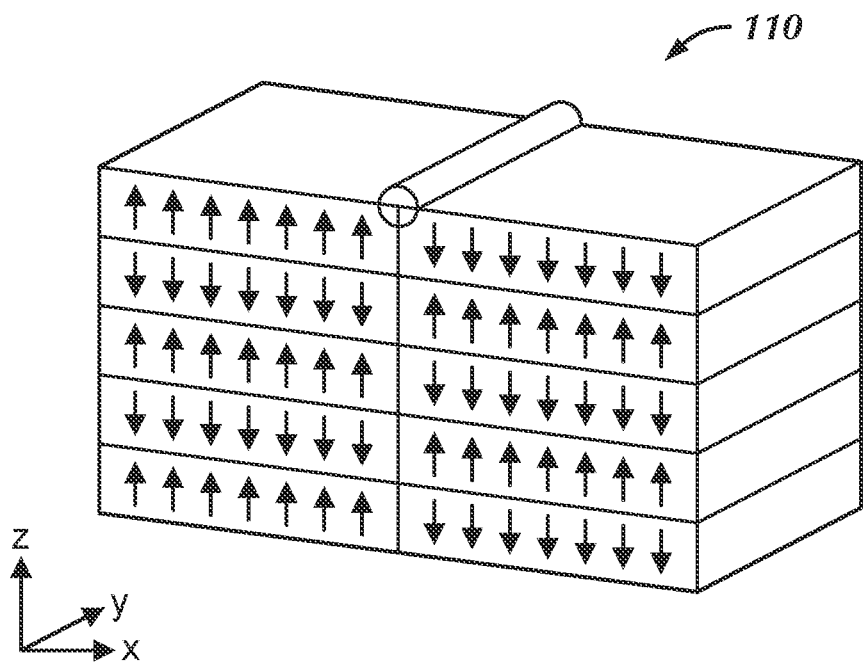
FIGS. 1(*a*)-1(*d*) depict a bulk domain wall structure and a surface step structure formed on a surface of an A-type AFM TI.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments.

The inventors note that surface and edge-state engineering of topological materials offers great promise for future electronic devices. Owing to the topological properties of the bulk of the material, surface states emerge that are protected from elastic and inelastic scattering. In particular topologically-protected chiral (one-way) or helical (2-way) edge states provide dissipation-less "quantum wires" with potential applications in sensor, low-power computing, and quantum information technologies. A crucial part of engineering such wires requires robust and tunable junctions between edge states.

The various embodiments provide an antiferromagnetic topological insulator that supports two distinct types of gapless unidirectional channels, one from antiferromagnetic domain walls and the other from single-height steps. Their distinct geometric nature allows them to intersect robustly to form quantum point junctions, and their presence at the surface makes them subject to control by magnetic and electrostatic local probes. Given the existence of stable and tunable junctions, the intrinsic magnetism and the potential for higher-temperature performance make this material system a promising platform for electron quantum optics and microelectronic applications. The stable and tunable junctions allow for the full control of the mixing and interference of edge-state wave functions.

Various embodiments provide a material whose magnetic symmetry group enforces a quantized bulk axion coupling of $\theta=\pi$, as in an ordinary 3D TI, but does not enforce the presence of gapless surface states. Instead, gapped surfaces may appear naturally on this material, and these gapped surfaces exhibit a half-quantized surface anomalous Hall conductivity (i.e., an odd integer times $e^2/2$ h) whose sign is determined by details of the magnetic order at the terminating surface. Manipulation of the surface termination and/or magnetic order in one region of the surface relative to a neighboring patch, or on one facet relative to another that meets it at a "hinge," may give rise to a chiral edge channel at the boundary between these patches or facets. Chiral edge states provide directional control of carrier propagation and (topological) protection against impurity backscattering.

Various embodiments contemplate the creation and manipulation of chiral edge channels on the surface of an antiferromagnetic topological insulators (AFM TI), a class of materials including $MnBi_2Te_4$, $MnBi_4Te_7$, $EuIn_2As_2$ and NpBi which may be described as intrinsic magnetic topological insulators, axion insulators and second-order topological insulators. These materials may provide both bulk and surface gaps on the order of hundreds of meV, allowing for potential room temperature device operation. Various embodiments also contemplate a novel quantum point junction (QPJ) at the surface of an AFM TI.

Figure 1B:
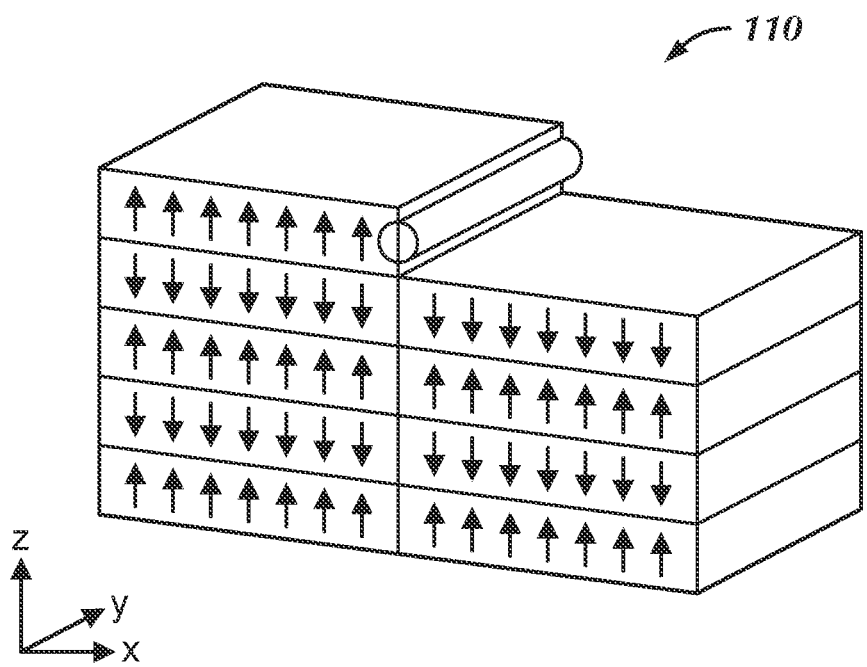
Figure 1C:
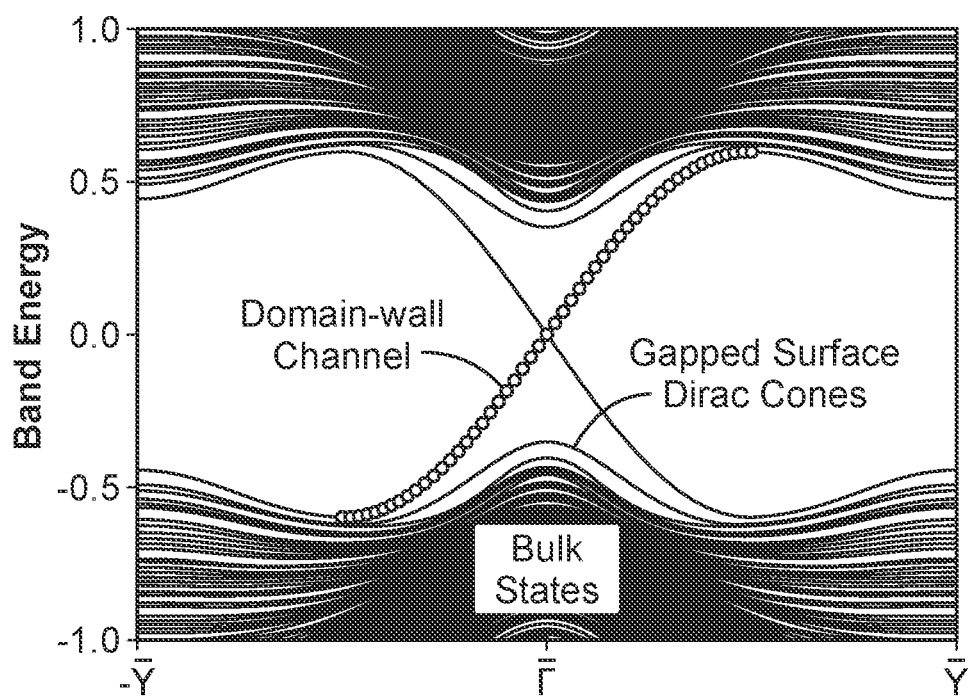
Figure 1D:
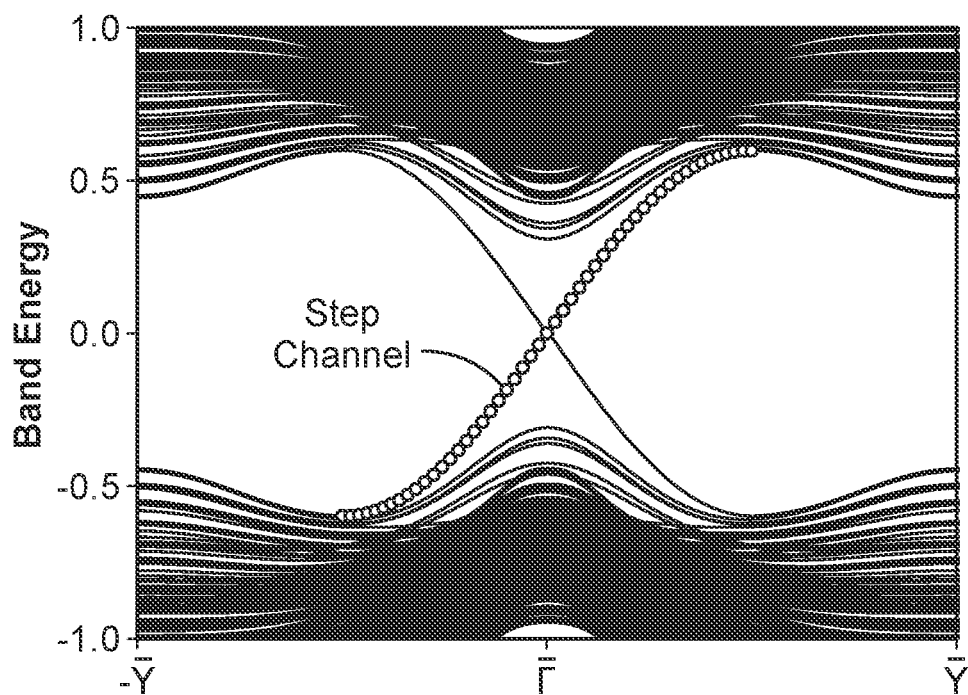

FIGS. 1(a)-1(d) depict a bulk domain wall structure and a surface step structure formed on a surface of an A-type AFM TI. Specifically, FIG. 1 depicts a chiral channel (cylinder 110) at the surface of an A-type AFM TI due to (a) a bulk domain wall; and (b) a surface step. FIG. 1(c) depicts surface band structures along (001) for the Hamiltonian in Eq. (8) in the presence of (c), a bulk domain wall; and (d) a surface step. The projection of the states on the chiral channels (cylinder 110) in (a) and (b) are also shown in FIGS. 1(c) and 1(d) as the dotted lines to illustrate the localization of the massless Dirac fermions that disperse linearly along the channel direction at low energy with velocities $v_{dw}$ in FIG. 1(c) and $v_{st.}$ in FIG. 1(d).

Specifically, FIGS. 1(a) and 1(b) show a prototypical spin arrangement in an AFM TI. The magnetic ordering is A-type AFM, i.e., with magnetization uniform in-plane but alternating from plane to plane along the stacking direction, which is taken to be along $\hat{z}$. Each individual layer can be thought of as adiabatically connected to a 2D Chern insulator, with the sign of the Chern number alternating from layer to layer. The sign of the surface anomalous Hall conductivity of $\pm e^2/2$ h is thus determined by the magnetic orientation of the last layer at the surface. As a result, two kinds of 1D chiral channels can occur at the surface. As shown in FIG. 1(a), the emergence of a bulk AFM domain wall at the surface reverses the sign of the anomalous Hall conductivity on either side of the resulting line defect, which therefore carries a topologically protected chiral channel denoted herein as a domain-wall channel. Alternatively, even if no bulk AFM domain walls are present, a single-height step can occur on the surface, as shown in FIG. 1(b). If it does, it also marks a sign reversal of the anomalous Hall conductivity when crossing the step, and thus carries a chiral edge channel as well. This is denoted herein as a step channel.

FIGS. 1(c) and (d) show the manifestation of the domain-wall and step channel in the surface band structure as described in the context of a tight-binding model as discussed/used throughout this Specification. The presence of either of these defects results in 1D linear dispersions in the otherwise gapped bulk and surface spectrum of the AFM TI. The states that comprise the chiral bands are exponentially localized in the vicinity of the channel, and host 1D massless Dirac fermions.

Figure 2A:
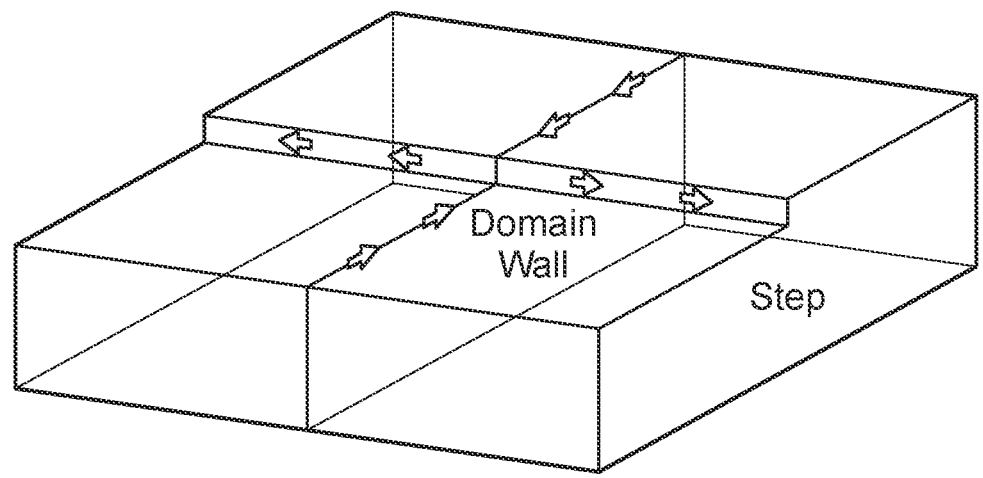
FIGS. 2(*a*)-2(*b*) depict a bulk domain wall structure and a surface step structure formed in an intersecting manner on a surface of an A-type AFM TI.
Figure 2B:
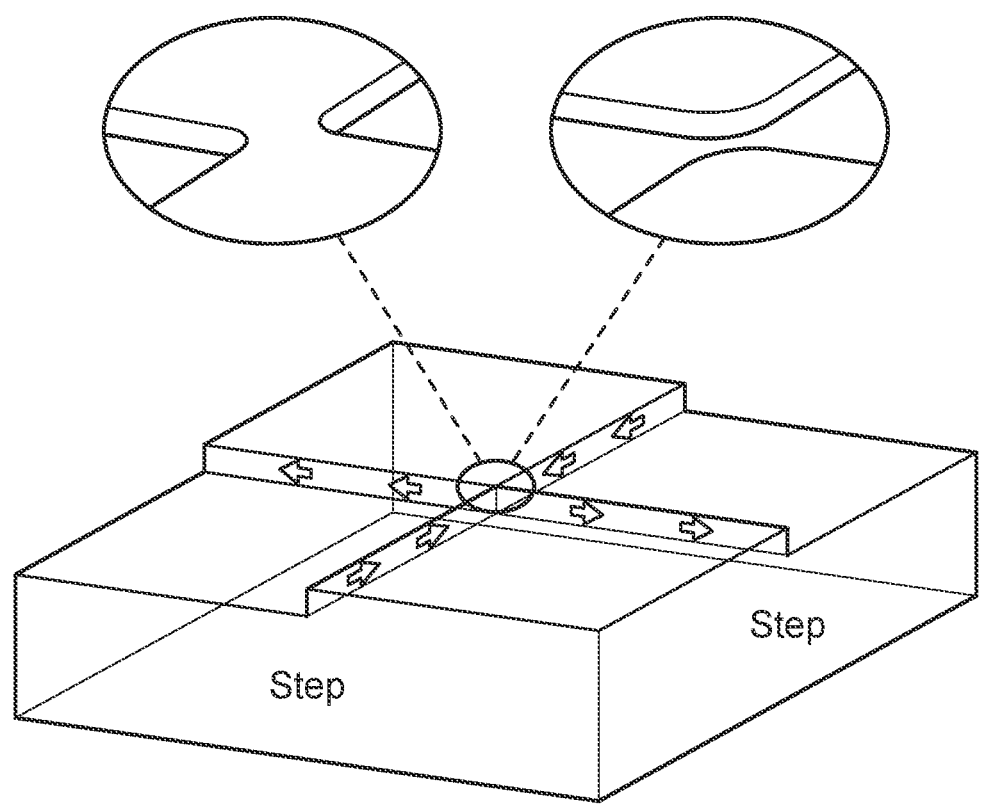

FIGS. 2(a)-2(b) depict a bulk domain wall structure and a surface step structure formed in an intersecting manner on a surface of an A-type AFM TI. Specifically, a novel opportunity opened by the presence of two different kinds of 1D chiral channels at the surface, is that these can be made to intersect, as shown in FIG. 2(a), and such intersections are expected to remain thermodynamically stable. In contrast, as illustrated in FIG. 2(b), an intersection between two surface steps can easily evolve via a pinch-off event into a configuration in which an isthmus of constant surface height separates the steps; indeed, the width of such an isthmus will tend to grow due to the line tensions of the steps, and the quantum junction will have been removed. A similar mechanism affects the intersection of two domain walls. In fact, setups like those depicted in the inset of FIG. 2(b) where two chiral channels come in close proximity, have long been used in quantum Hall systems to realize electron interferometers. These constructions, known as quantum point contacts (QPCs), enable tunneling between channels.

Construction of Intersecting Chiral Channels

Intersecting chiral channels may be constructed using a novel material system that is on the verge of discovery. In fact, these junctions were recently observed to appear naturally at the surface of the putative AFM TI $MnBi_2Te_4$. Moreover, it is shown that a QPJ can be controlled by scanning tips of the kind used in scanning tunneling microscopy (STM) and related methods. Here, the interest is in local probes that affect the magnetic moments and electrostatic potential, which are referred to as magnetic and electrostatic STM tips respectively. The properties of the QPJ by constructing the Hamiltonian associated with the system are depicted in FIG. 2(a), along with performing dynamic wave-packet (WP) simulations that allow the extraction of the S-matrix of the junction. The magnetic and electrostatic STM tips in proximity with the junction may be used to realize any unitary S-matrix. In addition, it is noted that the effect of symmetry breaking terms and weak disorder can be "gauged away" using the two tips.

The stability and tunability of the proposed junction, together with the intrinsic benefits of a magnetic topological material, can be of great utility in established and new applications involving unidirectional channels, such as electron interferometry, low-power electronics and quantum information processing.

Extracting the S Matrix

Figure 3A:
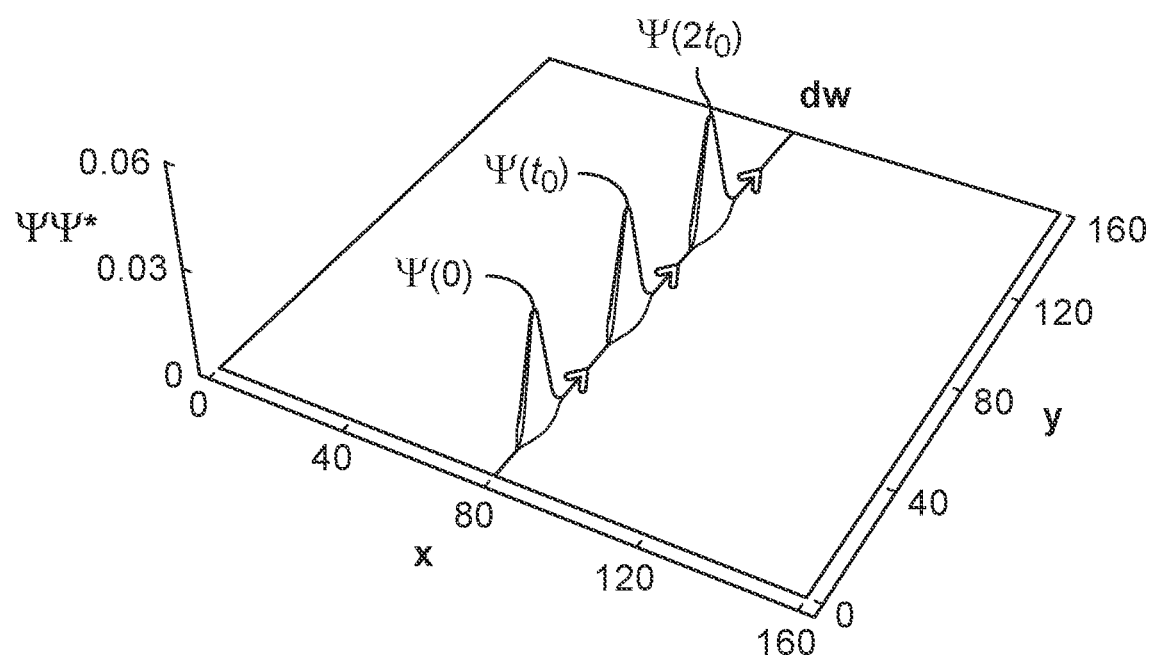
FIGS. 3(*a*)-3(*f*) graphically depict wave packet dynamics at the surface of the A-type AFM TI of FIG. 2.
Figure 3B:
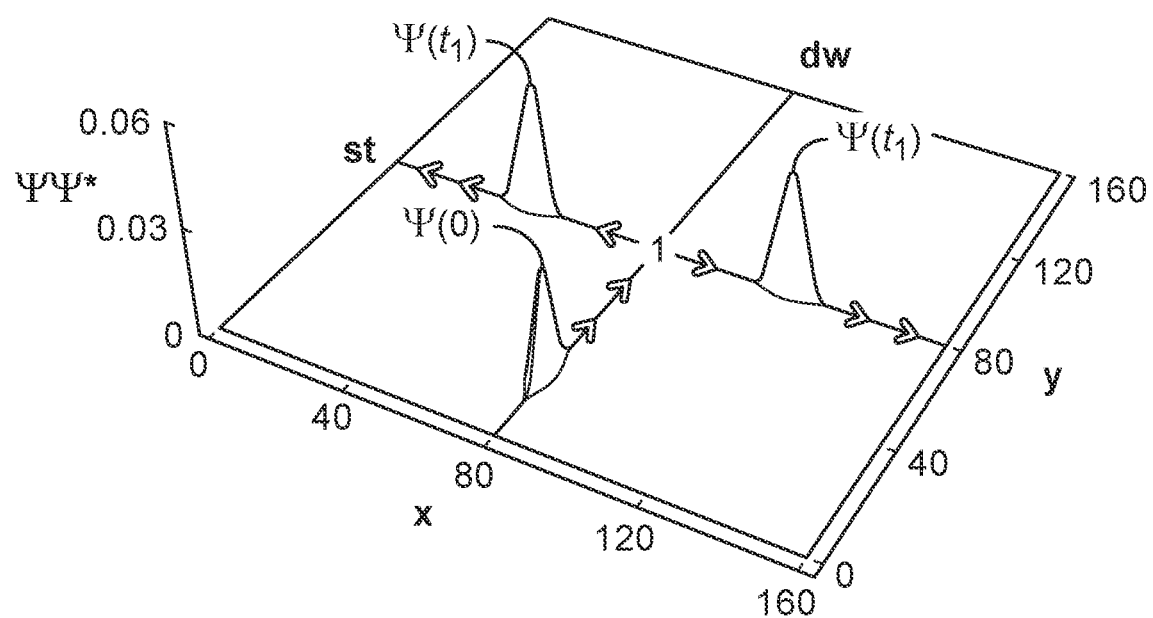

Begin by considering the WP dynamics at the surface of an AFM TI. FIGS. 3(a)-3(f) graphically depict wave packet dynamics at the surface of the A-type AFM TI of FIG. 2. FIG. 3(a) shows the calculated time evolution of a WP on a single domain-wall channel, while FIG. 3(b) shows that of a WP in the presence of the QPJ in FIG. 2(a) In both cases the dissipationless channels are protected from back-scattering by the insulating bulk and surface gaps. The wave function of the WP is thus exponentially confined to the vicinity of the one-dimensional channel, and it travels with a constant group velocity along the channel. In FIG. 3(b), a WP enters along the domain wall channel, gets split by the QPJ, and then the two components travel away from the QPJ along the step channels. Configurations in which multiple consecutive scattering events occur will be considered below.

FIG. 2(a) depicts the intersection of a domain-wall channel with a step channel results in a thermodynamically stable junction, i.e., small surface deformations can only move the junction but not remove it. FIG. 2(b) depicts the intersection of two step channels (or two domain-wall channels) is unstable. The inset shows how small deformations remove the junction. arrows indicate the direction of propagation on the chiral channels, while dark and bright surfaces indicate whether the anomalous Hall conductivity is $\pm e^2/2$ h respectively.

With respect to the behaviors discussed above, it is noted that the wave function of a WP propagating along a single domain-wall channel in direction y, as in FIG. 3(a), can be well approximated as $$\Psi_{\sigma\tau}^{dw}(x,y,z,t)=\chi_{\sigma\tau}^{dw}(x,z)f(y-y_0-v_{dw}t) \qquad (1)$$

where $\chi_{\sigma\tau}^{dw}$ (x,z) captures the transverse shape (x,z) and spin-orbital character ($\sigma$, $\tau$ indices respectively) of the WP, while f(y) is the envelope function of the WP, which is taken to be a Gaussian.

The WP is launched from position $y_0$ at time t=0 and travels with group velocity $v_{dw}$ (which is set by the surface state dispersion in FIG. 1(c)). In modeling at this level, neglect spreading of the WP, which is negligible in simulations. Similar considerations apply to the propagation of a WP on a step along x traveling with group velocity $v_{st}$ (that is set by the surface state dispersion in FIG. 1(d)).

Figure 3C:
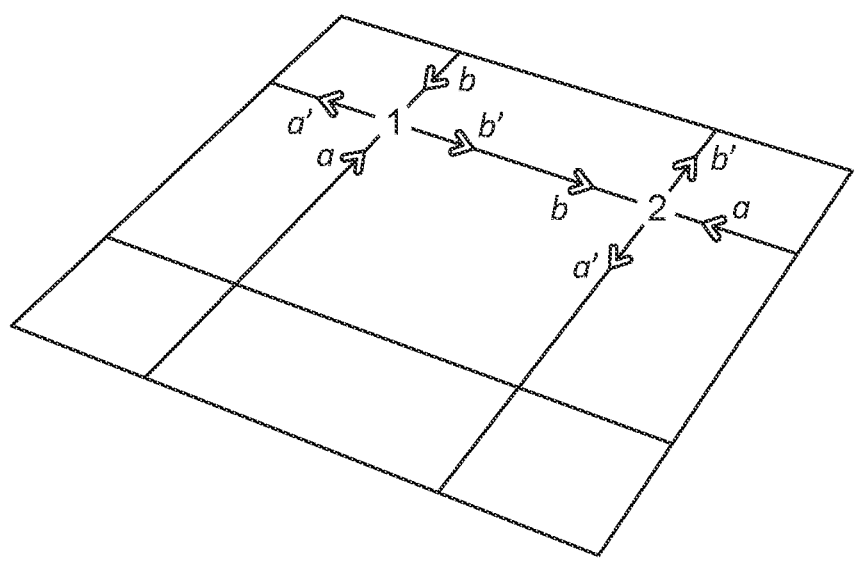

Consider the scattering event depicted in FIG. 3(b), where an incoming WP splits after encountering the QPJ. Using unprimed labels a and b to refer to the two incoming domain-wall channels of Junction 1, as in FIG. 3(c). Note that the extra junctions are the result of in-plane periodic boundary conditions. The incoming initial conditions are specified by amplitudes $\varphi_a=1$ and $\varphi_b=0$. Now let $t_1$ indicate a time after the scattering through Junction 1 is complete, but before Junction 2 is encountered. Labeling the two outgoing step channels as a' and b', and adopting once and for all the arbitrary convention that a→a' and b→b' result from taking left turns, as shown in FIG. 3(c). As illustrated in FIG. 3(b), one component of the WP moves to the right and the other to the left, with velocities $v_{st}$ and $-v_{st}$ respectively. At time t1 both will be centered at a distance x1 relative to the junction, and the following may be expected:

$$\Psi_{\sigma\tau}^{st}(x,y,z,t_1)=\phi_{a'}\tilde{\chi}_{\sigma\tau}^{st}(y,z)f(x+x_1)+\phi_{b'}\chi_{\sigma\tau}^{st}(y,z)f(x-x_1) \qquad (2)$$

where $\phi_{a'}$ and $\phi_{b'}$ are the amplitudes (magnitude and phase) describing scattering from incoming channel a into channels a' and b' respectively, and $\tilde{\chi}^{st}$ is the time-reversed partner of $\chi^{st}$. These expectations are well reproduced in full numerical calculations which therefore allow extraction of the amplitudes $\phi_{a'}$ and $\phi_{b'}$.

Similar calculations, where the incident WP approaches Junction 1 along the $-\hat{y}$ direction on channel b, allow extracting the corresponding amplitudes that result for initial conditions of $\varphi_a=0$ and $\varphi_b=1$. Thus, there can be modeled a combined scattering event via $$\begin{pmatrix} \phi'_a \\ \phi'_b \end{pmatrix} = S \begin{pmatrix} \phi_a \\ \phi_b \end{pmatrix} \qquad (3)$$

where the elements of the S-matrix are determined by the four complex amplitudes discussed above.

Figure 3D:
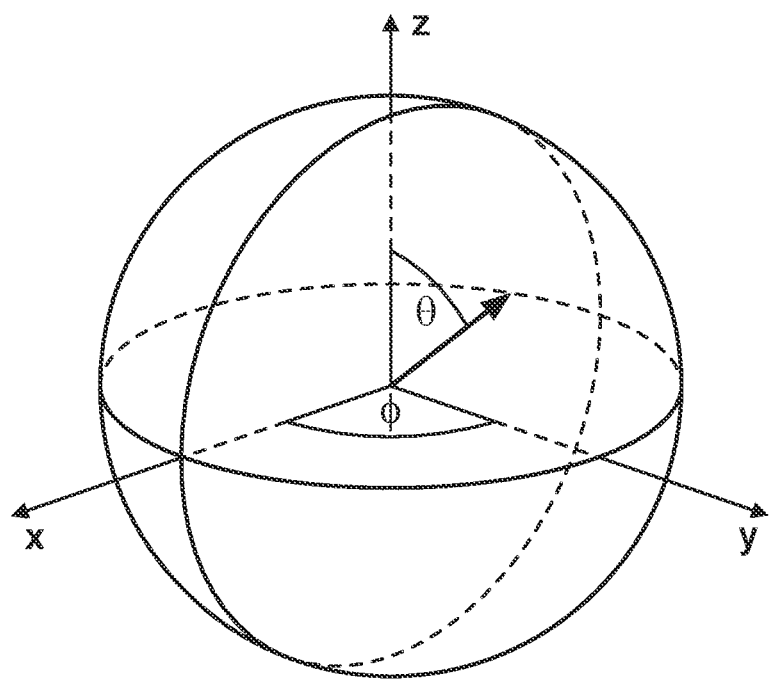

In this way, the evolution of the system of propagating WPs is mapped onto that of a two-level quantum system, so that it is enough to restrict S to be an SU(2) matrix. The characterization of a junction by such an S-matrix is a central element of the theory. It is illustrative to represent the initial or final state as a point on the Bloch sphere, $$\begin{pmatrix} \phi_a \\ \phi_b \end{pmatrix} = \begin{pmatrix} \cos\left(\frac{\theta}{2}\right) \\ e^{i\varphi}\sin\left(\frac{\theta}{2}\right) \end{pmatrix} \qquad (4)$$

where $\theta$ determines the relative WP magnitude on channels a and b and $\varphi$ their phase difference, as illustrated in FIG. 3(d).

Figure 3E:
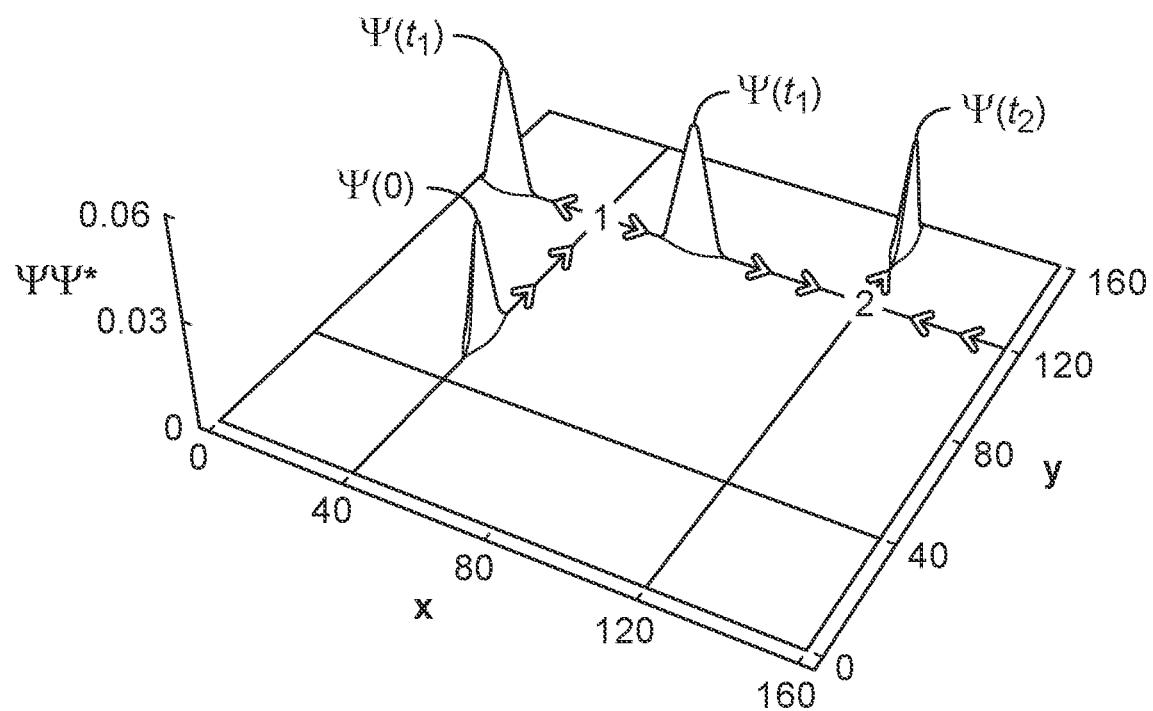
Figure 3F:
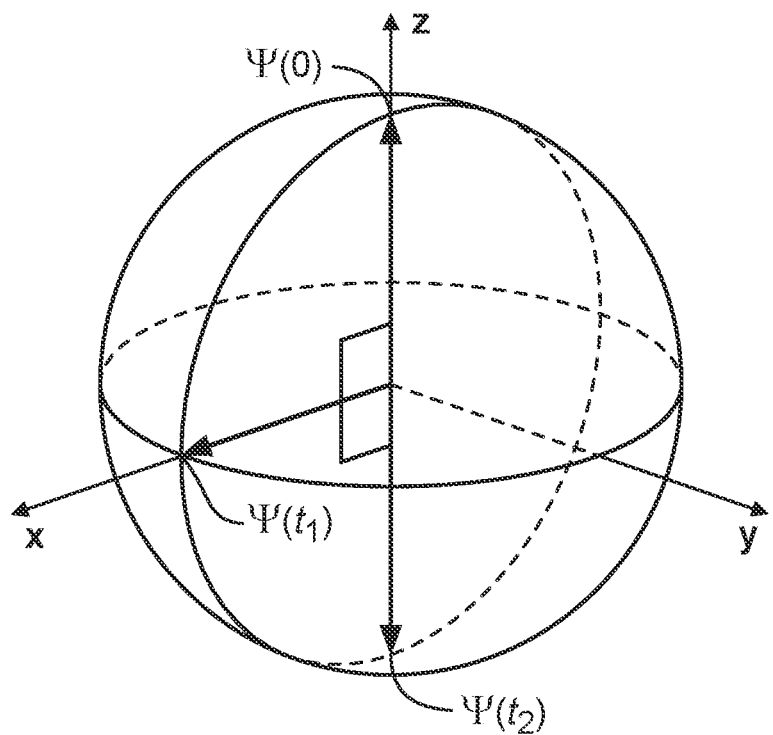

Each junction scattering event can then be described by the action of the corresponding junction S-matrix on the spinor representation of the channel states, regarded as a qubit state, and the result of consecutive QPJ scattering events, as in FIG. 3(e), corresponds to the action of consecutive gates acting on these qubits as illustrated in FIG. 3(f).

FIG. 3(a) depicts snapshots of the WP showing the propagation on the domain-wall channel. FIG. 3(b) depicts a WP scattering at Junction 1 and splitting into two spatially separated outgoing components of the wavefunction. FIG. 3(c) depicts a channel labeling convention for Junction 1 and 2. FIG. 3(d) depicts qubit representation of a WP state on the Bloch sphere. FIG. 3(e) depicts initial WP splits after encountering Junction 1, where the two components then meet at Junction 2, interfering destructively on channel a' and constructively on channel b'. FIG. 3(f) depicts Qubit representation of the time evolution in FIG. 3(e). WP plots in FIG. 3(a), FIG. 3(b), FIG. 3(e), are calculated from the (001)-projected probability densities at different times.

Returning to a more specific discussion of the full time-evolution calculations, and the analysis of them in terms of the framework sketched above. FIG. 3(e) shows the time evolution of a WP initiated on channel a. The WP propagates towards and then scatters at Junction 1, splitting into two equal parts. Later the two WPs pass through Junction 2, interfering destructively and constructively on outgoing channels a' and b' respectively. The time evolution of the WP configuration can be described as a qubit passing through two gates. Using the convention of FIG. 3(c), the calculated S matrix of Junction 1 and 2 corresponds to the Hadamard gate $$S_1 = S_2 = \frac{1}{\sqrt{2}}\begin{pmatrix} 1 & -1 \\ 1 & 1 \end{pmatrix} \quad (5)$$

so that the final state is related to the initial one by applying the Hadamard gate twice. Geometrically the S matrix is expressed as:

$$S = R_{\hat{n}}(\varphi) = e^{-i\frac{\varphi}{2}\hat{n}\cdot\sigma} \quad (6)$$

describes a qubit rotation by an angle $\varphi$ through an axis $\hat{n}$ and $\sigma=(\sigma_x, \sigma_y, \sigma_z)$ is a vector of Pauli matrices. Since $S_1=S_2=R_{\hat{y}}(\pi/2)$, each application rotates the qubit by 90° around the $\hat{y}$ axis of the Bloch sphere, resulting in an overall reversal of the pseudospin as shown in FIG. 3(f).

Controlling the S Matrix

Before explaining how the control of the S matrix is achieved, it is illustrative to break down the action of S into three stages. First the propagation along the incoming channels; since these cannot scatter into one another, this is represented by a diagonal matrix $S_{dw}$. Then there is the scattering $S_{pj}$ at the QPJ itself, followed by another channel-diagonal propagation $S_{st}$ on the outgoing step channels. The overall S matrix can then be written in terms of the Pauli matrices as:

$$S=S_{st}S_{pj}S_{dw}=e^{-\gamma\sigma_z/2}e^{-i\beta\sigma_y/2}e^{-\alpha\sigma_x/2}, \quad (7)$$

where $S_{pj}$ is expressed as a real orthogonal matrix because the phases can be absorbed into $S_{dw}$ and $S_{st}$.

Remarkably, $(\alpha, \beta, \gamma)$ are exactly the three Euler angles that can be used to express any SU(2) matrix. Thus control over the three Euler angles results in a universally programmable gate.

To control the S matrix, various embodiments use two local probes in the vicinity of the junction. The first one, which is referred to as a magnetic STM tip, affects the local magnetic moments, and as shall be seen, controls the magnitudes of the S matrix. The second probe is an electrostatic STM tip modifying the site energies under the tip, thus controlling the phases of the S matrix. The effect of the magnetic tip is controlled through the coefficient $V_Z$, and that of the electrostatic tip through $V_G$, both acting in the local vicinity of the junction. For more details on how this is modeled, see Eq. (9).

a. Magnitude control. Set $V_G=0$, leaving the electric potential constant throughout the crystal so that no extra phase evolution occurs during the propagation ($\alpha=\gamma=0$), and vary the strength of the magnetic tip $V_Z$. This affects the left-right magnitude splitting, i.e., $S=R_{\hat{y}}(\beta)=e^{-i\beta\sigma_y/2}$ in Eq. (7), with $\beta=\beta(V_Z)$. To understand the mechanism behind the magnitude control, first consider the extreme scenario depicted in FIG. 4(a).

Figure 4A:
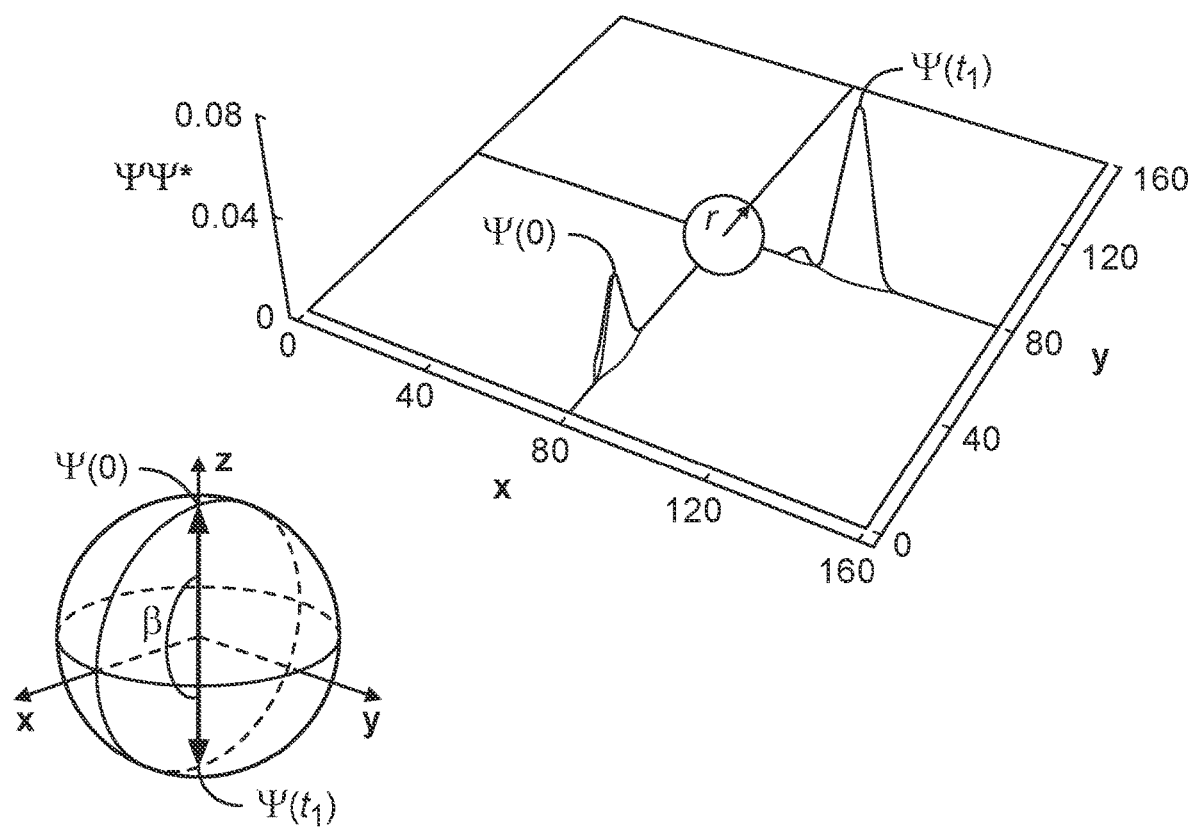
FIGS. 4(*a*)-4(*f*) graphically depict wave packet dynamics for a scenario useful in understanding the various embodiments.
Figure 4B:
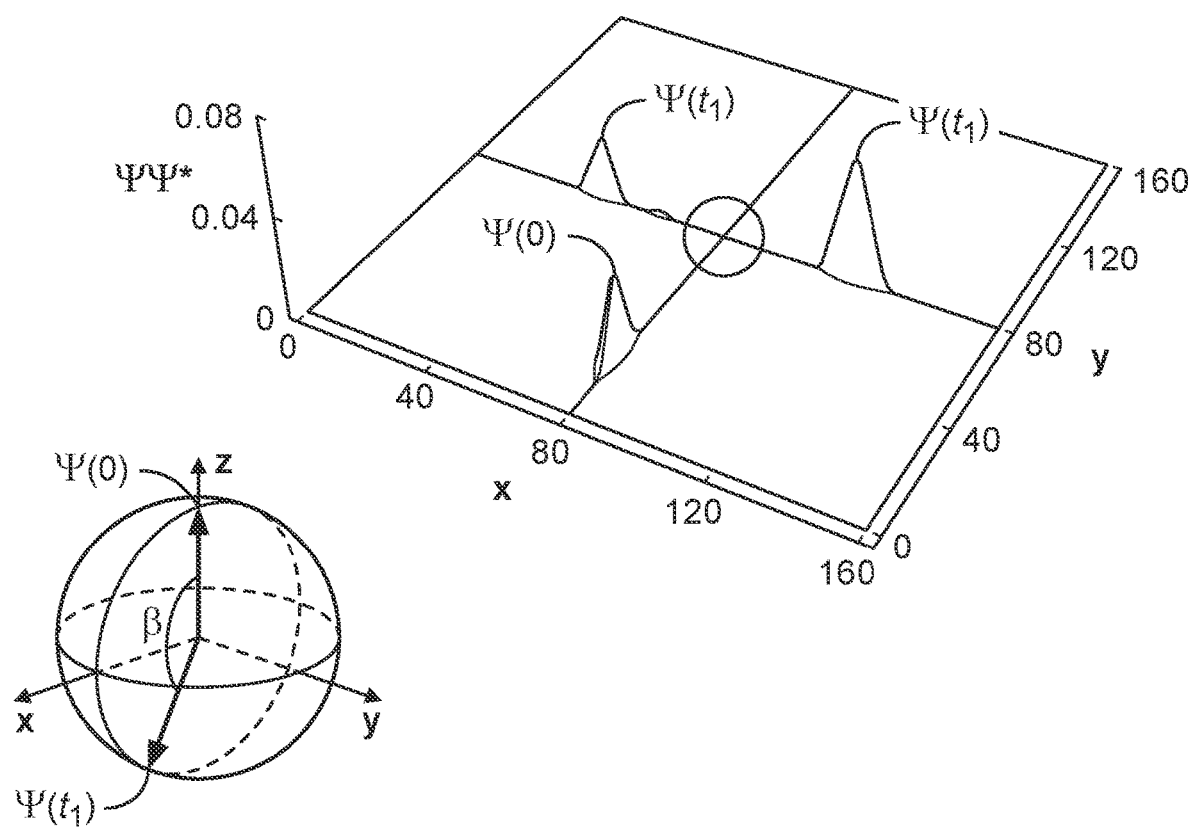
Figure 4C:
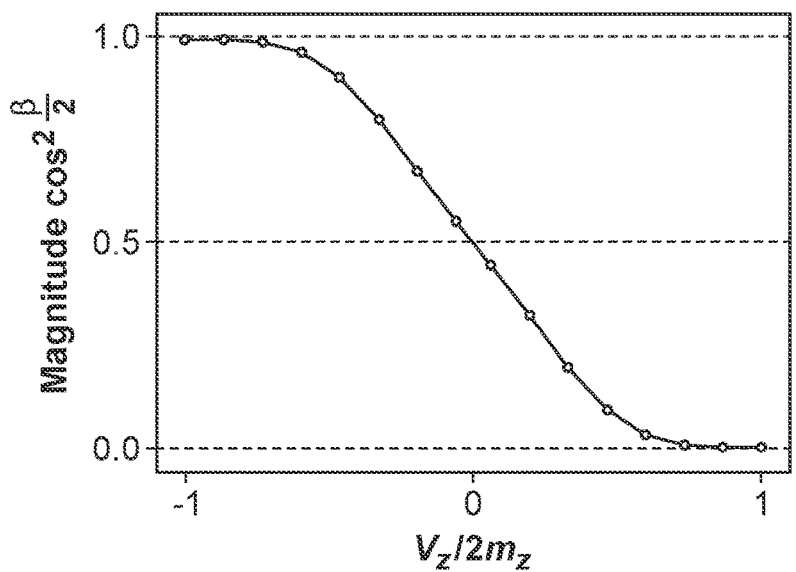
Figure 4D:
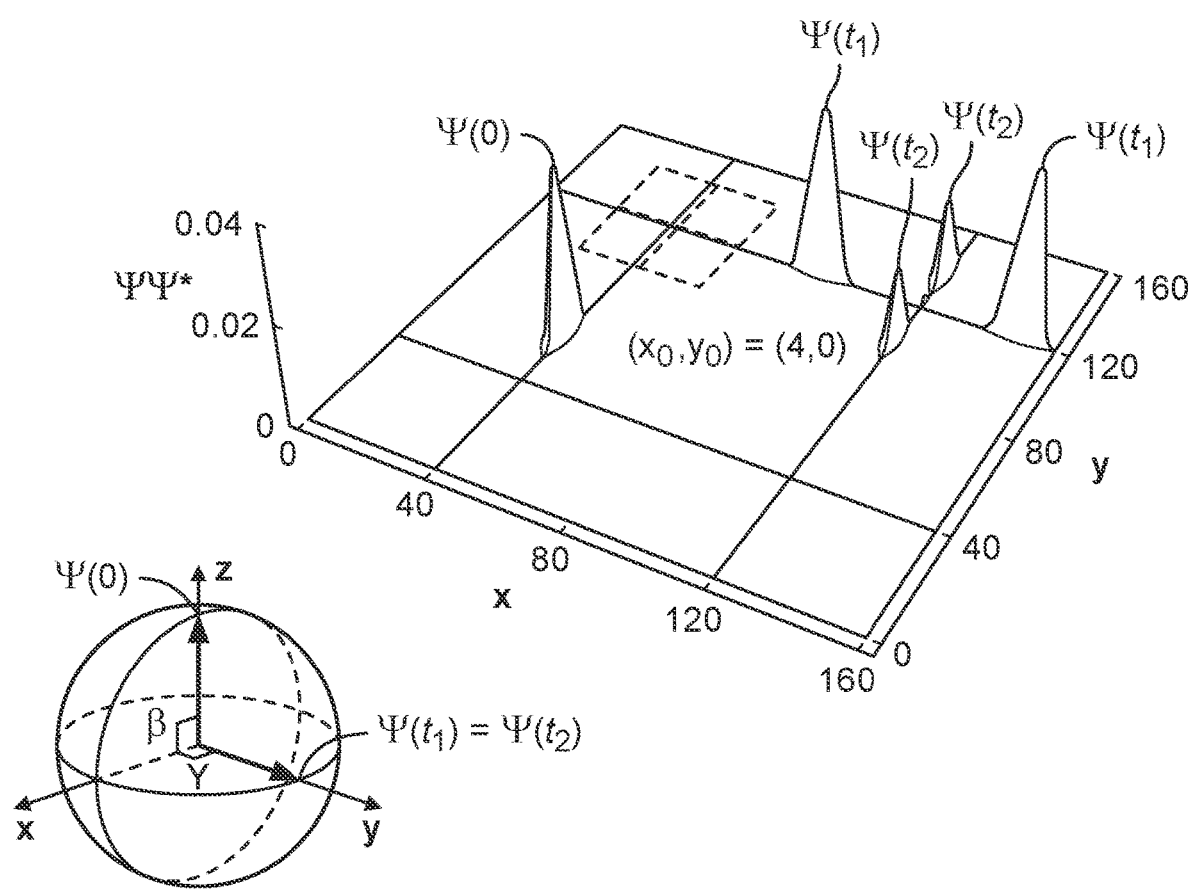
Figure 4E:
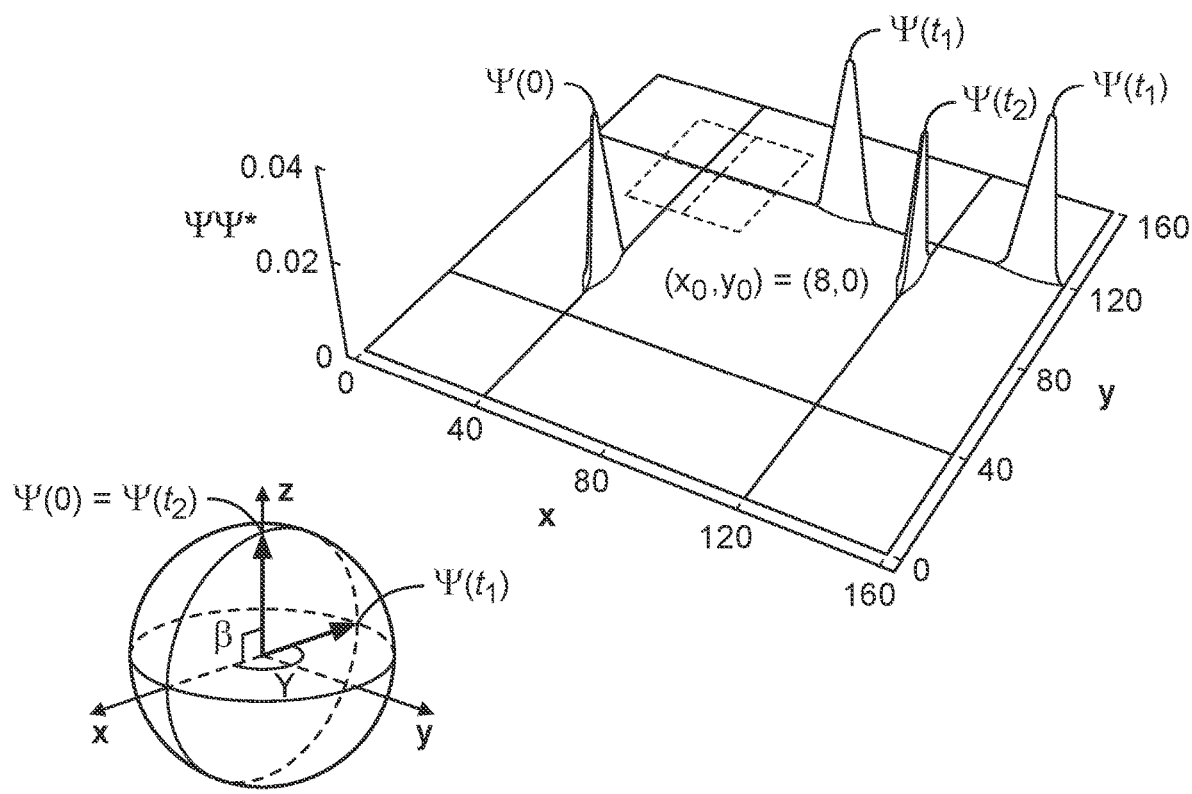
Figure 4F:
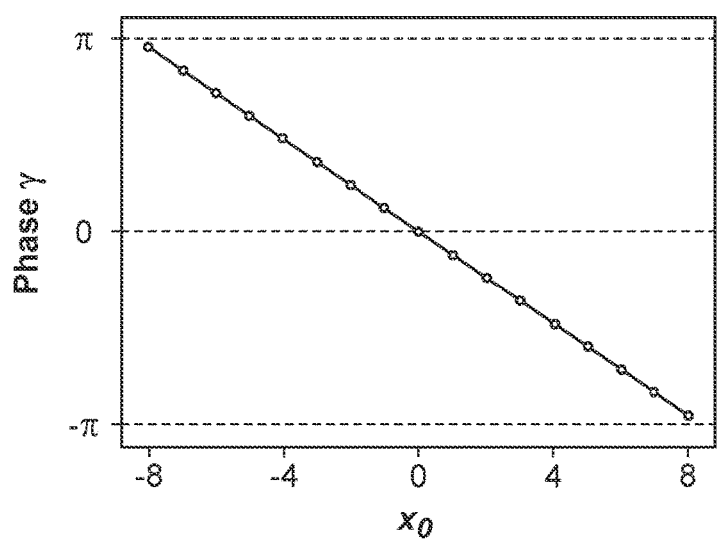

FIGS. 4(a)-4(f) graphically depict wave packet dynamics for a scenario useful in understanding the various embodiments. Specifically, FIGS. 4(a)-4(f) illustrate control of a quantum point junction using a magnetic and electrostatic local probe. FIG. 4(a) depicts the magnetic STM tip with $V_Z=2m_Z$ in Eq. (9) which has polarized the surface spins in a circular region centered at the junction resulting in two uncoupled channels. FIG. 4(b) depicts partially polarized region with $V_Z=0.4$ $m_Z$ which causes unequal splitting of the WP. FIG. 4(c) depicts numerical calculation of the magnitude splitting $\cos^2\beta/2$ as a function of $V_Z$. Each value corresponds to the integral of $|\Psi(t_1)|^2$ on channel a' of Junction 1. Applying the electrostatic STM tip with $V_G=0.6$ in Eq. (9) at Junction 1 induces a phase difference between the outgoing WPs which then affects how they interfere at Junction 2. FIG. 4(d) depicts that the center of the rectangular region $\Omega_G$ is chosen so that $\gamma=\pi/2$. FIG. 4(e) depicts that the center of the rectangular region $\Omega_G$ is chosen so that $\gamma=\pi$, making the WPs constructively (destructively) interfere on channel a(b) of Junction 2. FIG. 4(f) depicts numerical calculation of the angle $\gamma$ from the relative phase of the outgoing WPs at $t_1$ as a function of $x_0$. The phases of the outgoing WPs are determined from the inner product between $\Psi(t_1)$ in the presence and absence of the phase gate.

Here a strong magnetic STM tip has polarized the surface magnetization in the vicinity of the junction (orange circular region), forcing the anomalous Hall conductivity to be uniformly $+e_2/2$ h in that area. This essentially "removes" the junction, and the WP is completely transferred from the domain-wall (channel a) to the edge of the step (channel b'), so that $S_1=R_{\hat{y}}(\pi)$. An example of partial polarization, is shown in FIG. 4(b), while the results of tuning $V_Z$ over the entire range of tip strength is shown in FIG. 4(c), where plotting the numerically calculated value of $\cos^2(\beta/2)$, which represents the asymmetry between left- and right-scattered WPs, as a function of $V_Z$. This demonstrates the universal control of the Euler angle $\beta$ using a magnetic STM tip.

b. Phase control. To illustrate the phase control, set $V_Z=0$, fix $V_G$ to a non-zero value (see Eq. (9), and control the position of the electrostatic tip. Then $S_j=R_{\hat{z}}(\gamma) R_{\hat{y}}(\pi/2) R_{\hat{z}}(\alpha)$, where $\alpha$ and $\gamma$ are determined by the position $(x_0, y_0)$ of the tip relative to the junction, as described by Eq. (10). The electrostatic tip is depicted as a shaded square with origin $(x_0, y_0)$ in FIGS. 4(d) and (e). In fact, the choice of $\varphi_a=1$ and $\varphi_b=0$ simplifies the situation, since $R_{\hat{z}}(\alpha)$ just corresponds to an overall phase, which is not of interest. Physically, the WP splits equally at the first junction ($\beta=\pi/2$), and the electrostatic STM tip, corresponding to the second term in Eq. (9), is then used to control the relative phases of the outgoing WPs via the $R_{\hat{z}}(\gamma)$ term.

FIG. 4(d)-(f) illustrate the phase control by applying the electrostatic gate on Junction 1. To see the effects of the phase manipulation, consider the interference that conveniently occurs when the WPs meet again (due to periodic boundary conditions in x and y) at Junction 2. In FIG. 4(d), the electrostatic tip is centered four unit cells to the right at $(x_0, y_0)=(4, 0)$, which approximately makes $\gamma=\pi/2$ so that $S_1=R_{\hat{z}}(\pi/2) R_{\hat{y}}(\alpha(\pi/2)$, while $S_2=R_{\hat{y}}(\alpha(\pi/2)$ as before. After scattering at Junction 1 the outgoing WP, whose state corresponds to a vector pointing along the +y direction of the Bloch sphere, becomes the incoming WP at Junction 2. Since Junction 2 acts as a rotation around the y-axis, it does not affect the qubit state of the WP. Similarly, in FIG. 4(e), set $(x_0, y_0)=(8, 0)$, so that after encountering Junction 1 the qubit state points along $-\hat{x}$, and after Junction 2 it returns to its initial $+\hat{z}$ state. FIG. 4(f) presents a numerical calculation of $\gamma$ versus $x_0$. This is done by calculating the phase of the WPs just after it scatters off Junction 1. What is found is a linear behavior as expected from Eq. (10).

In summary, using the two STM tips enables control of $\alpha$, $\beta$, and $\gamma$ independently in Eq. (7), so that the junction can be made to implement any SU(2) gate.

c. Symmetries. The QPJ has many artificial symmetries that in any real application will be absent. For example, the inventors have seen that it naturally implements the Hadamard gate so that the WP splits equally after encountering the QPJ; this behavior is enforced by the mirror symmetries Mx and My of the bulk Hamiltonian, and should not be expected in general. Breaking these symmetries does not affect the ability of the protocol to control the S matrix.

d. Stability to disorder. A significant advantage of the QPJ design presented here is that the chiral channels on the domain walls and steps cannot backscatter and are therefore expected to be robust against the presence of weak disorder (i.e., such that the average bulk and surface gaps remains open). A demonstrate this topological protection of the QPJ may be made by introducing disorder into the model via a short-ranged random potential that is sampled from a Gaussian distribution. Although the qubit gets dephased in a different way for each realization of disorder, the electrostatic tip can be used to recalibrate the QPJ. That is to remove the random offsets arising from the specific impurity configuration, thus enabling the control of the junction even in the presence of weak disorder.

Discussion

Figure 5A:
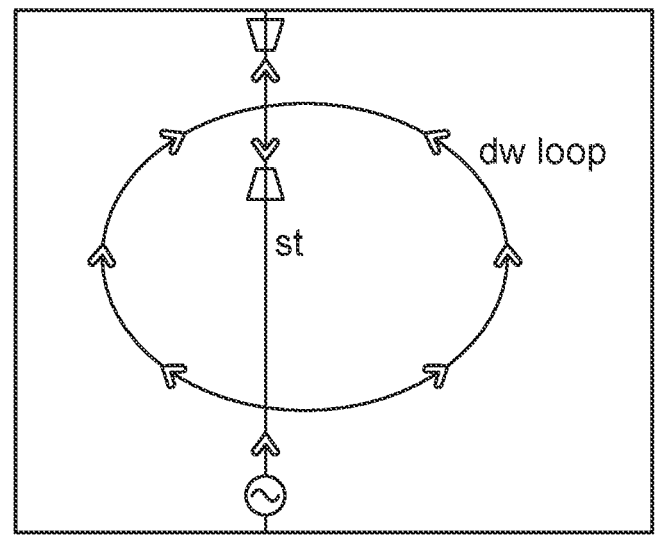
FIGS. 5(*a*)-5(*b*) illustrates an exemplary Mach-Zehnder interferometer at the surface of an AFM TI and the construction of a controlled-phase gate.

Disclosed herein is a versatile new platform for performing electron quantum optics. It is not hard to see how existing constructions, such as the Mach-Zehnder electron interferometer can be implemented directly on the surface of an AFM TI FIG. 5(a) shows a domain-wall loop channel intersecting a step channel. In this case, the interferometer works by splitting the incoming current (that flows on the step channel) in two parts that encircle the area defined by the domain-wall loop and meet at the second QPJ where they interfere. An Aharonov-Bohm phase can be introduced by threading the loop with a magnetic flux. In this way, varying the external magnetic field results in oscillations of the output conductance. The ability to control the S matrix of the QPJs means they can be calibrated so that the interferometer can be used as a sensitive sensor.

In the quantum-Hall regime of 2D electron gases, the long edge-state coherence length and the on-demand creation of indistinguishable, single-electron WPs have inspired ambitious proposals that consider electron interferometers as platforms for quantum information processing. In this approach, electronic flying qubits—another prominent scheme is based on photonic flying qubits—are subjected to quantum operations while they are being coherently transferred, providing control over qubit separation and non-local entanglement. In contrast to photons, electrons are subject to Coulomb interactions, making them vulnerable to dephasing but, at the same time, allowing control of the entanglement strength and manipulation of the phase.

Figure 5B:
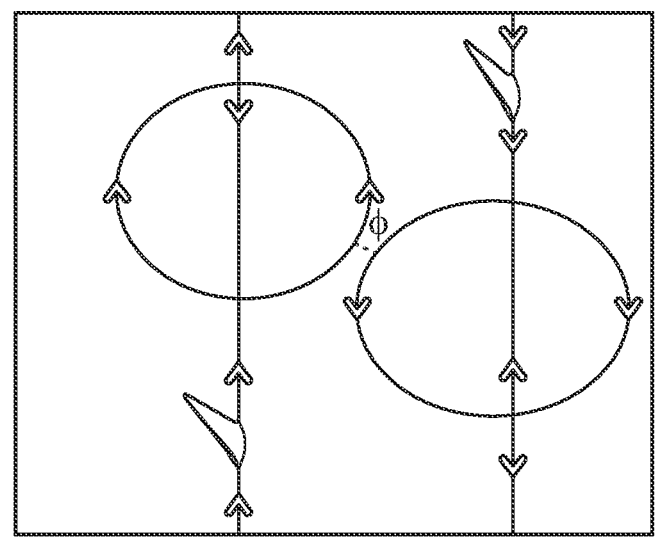

In the context of quantum Hall systems, entangling devices have been constructed by Coulomb-coupling two Mach-Zehnder interferometers to induce a relative phase $\varphi$ between the WPs of the two coupled channels. These devices can be used as electronic quantum erasers or even as entangling quantum gates, i.e., controlled phase gates. It is shown herein that QPJs can implement any single-qubit gate, a gate such as that FIG. 5(b) can be adopted to perform the two-qubit entanglement for a universal set of quantum gates. It is noted that chiral Majorana fermions, first seen in magnetic TI-superconductor structures and more recently in topological superconductors, are the superconducting analog of the chiral fermions discussed here. It has been proposed that topological quantum computing can be achieved using WPs propagating on chiral Majorana channels. An interesting question is whether analogs of robust QPJs can be constructed in the superconducting case.

Finally, a comment on issues of temperature of operation and decoherence. In one sense, the disclosed embodiments are robust to higher temperatures than quantum Hall systems; only requiring that the operating temperature to be small compared to the Neel temperature and the band gap in which the chiral mode is propagating. Thus, operation at tens of Kelvins is plausible for some future materials realization. Any application that is sensitive to decoherence will require operation at lower temperatures, perhaps comparable to those needed for the quantum Hall platform, to avoid dephasing due to electron-electron, electron-phonon and electron-magnon interactions. Nonetheless, the absence of backscattering strongly suppresses these dephasing processes relative to a normal quasi-one-dimensional wire and it is expected this will lead to a long edge state coherence length. In the quantum Hall context for example, edge state decoherence has been studied using Mach-Zehnder interferometry, demonstrating coherence lengths up to 100 µm. Since each quantum operation is performed within L≈1 µm, it should be possible to perform many qubit operations before decoherence sets in. An implementation of the Mach-Zehnder interferometer on the surface of an AFM TI would open the path to the study of coherent transport in this exciting new family of materials.

Various embodiments disclosed herein demonstrate the use of antiferromagnetic topological insulators to realize robust quantum point junctions at their surfaces due to the existence of two types of chiral channels (domain-wall and step) appearing on their surfaces. By identifying the two incoming channels with the two "code" states of a qubit, the results show that the S matrix of the quantum point junction acts as a single-qubit gate rotating the state vector of the qubit to produce the two outgoing channels. Furthermore, it is shown that magnetic and electrostatic tips from scanning tunneling microscopy can modify the junction so that its S matrix can perform any rotation on the Bloch sphere, realizing a universal one-qubit gate. In addition, the considered effects of symmetries and disorder and have illustrated that these affects can be "gauged" away through calibrating the junction. Finally, the discussion herein of the potential applications of the novel quantum point junction provide the basic unit for various other novel devices with applications in quantum computing and sensing.

Various methods according to the embodiments are also provided, such as the following:

Method A: Model Hamiltonian. Consider an adaptation of a simple four-band tight-binding model proposed by Bernevig et al. to describe systems exhibiting a topological phase transition mediated by a single band inversion at $\Gamma$. The simplicity of the model makes detailed calculations practical even for large systems. The model is written in terms of two spinful orbitals per lattice site and takes the form:

$$H_0 = m \sum_{\ell} c_{\ell}^{\dagger} \tau^z c_{\ell} + \frac{t}{2} \sum_{\ell\ell'}' c_{\ell}^{\dagger} \tau^z c_{\ell'} + \qquad (8)$$

$$-\frac{i\lambda}{2}\sum\nolimits_{\ell\ell'}' c_\ell^\dagger \tau^x \hat{n}_{\ell\ell'} \cdot \sigma c_{\ell'} + m_z \sum\nolimits_\ell (-)^{\ell_z} c_\ell^\dagger \sigma^z c_\ell$$

Here $\ell$ labels a lattice site $R_\ell = (\ell_x, \ell_y, \ell_z)$ on the unit cubic lattice, indicates a sum over nearest neighbor sites, and $\hat{n}\ell\ell'$, is the nearest neighbor unit vector. Adopting an implied sum notation for the orbital and spin degrees of freedom, illustratively $c_\ell^\dagger \tau^\mu \sigma^\nu c_{\ell'} = \Sigma_{ij,st} c_{\ell is}^\dagger \tau_{ij}^\mu \sigma_{st}^\nu c_{\ell' jt}$, where $\tau$ and $\sigma$ are Pauli matrices for orbital and spin degrees of freedom respectively, and $c_{\ell is}^\dagger$ creates an electron on site $\ell$ on orbital i with spin s.

The first three terms in Eq. (8) correspond to the model of Bernevig et al. for a strong topological insulator, often written in k-space as $H_{STI}(k) = m\tau^z + \Sigma_{i=x,y,z} t \cos(k_i)\tau^z + \lambda \sin(k_i)\tau^x \sigma^i$. In the last term in Eq. (8), $m_z$ is the strength of the staggered Zeeman field corresponding to A-type (layered) AFM order, doubling the unit cell and converting the model to represent an AFM topological insulator. Time reversal itself is now broken, but time reversal followed by a unit translation along $\hat{z}$ is a good symmetry. For the choice of parameters, the model is in the topological phase, with a formal magnetoelectric coupling of $(\theta/2\pi)(e^2/h)$ with axion coupling $\theta = \pi$. As a result, $\hat{z}$-normal surfaces are naturally gapped and carry an anomalous Hall conductivity of $\pm e^2/2h$.

Method B: Wave-packet construction. Construct the initial WPs in the space of momentum $k_\|$ along the direction of propagation. Calculate the surface band structure for a supercell Hamiltonian $H_{dw}$ or $H_{st}$ containing a domain wall or step, whose presence results in mid-gap bands localized on the conducting channels in the otherwise gapped surface, as shown in FIGS. 1(c) and (d), respectively. Note that technically each slab contains two domain walls and two steps. In the domain wall case, the configuration as a whole is invariant under time reversal times inversion, so the bands shown are Kramers degenerate.

Next, construct the WP by making a quantum superposition of channel-localized solutions according to a $k_\|$-space envelope function that is taken to be a Gaussian. This results in a WP that is localized in all three real space dimensions. This is then used as the initial wave function $\Psi(0)$ of the time-evolution problem for the much larger system that includes the QPJ and is described by the Hamiltonian $H_{QPJ}$. Having defined $H_{QPJ}$ as the model Hamiltonian $H_0$ in the presence of an antiferromagnetic domain wall and a single-height step that intersect in the center of the surface.

Method C: Wave-packet dynamics. To avoid finite-size effects, the system size L should be much larger than the extent of the WPs along the channel. When both a domain wall and step are present, momentum is no longer a good quantum number in any direction, so compute the time evolution entirely in real space. This is done using Chebyshev series expansion methods applied to the time-evolution operator $e^{-iHt}$. Using slabs of size 160×160 in-plane and 16 cells thick, enough to minimize finite-size effects, and adopt a Chebyshev expansion order of $N_C = 2^{11}$ so that the method may time evolve the state accurately over the needed time intervals.

Method D: STM tip modeling. To model the effects of the magnetic and electrostatic STM tips, extend the QPJ Hamiltonian ($H_{QPJ}$) with two spatially dependent terms $$\tilde{H}_{QPJ} = H_{QPJ} + V_Z \Sigma_{\ell \in \Omega_Z} c_\ell^\dagger \sigma^z c_\ell + V_G \Sigma_{\ell \in \Omega_G} c_\ell^\dagger c_\ell \quad (9)$$

where the second term modifies the Zeeman interaction in a region $\Omega_Z$ and the third term shifts the energy of all orbitals and spins uniformly inside a region $\Omega_G$.

For a positive $V_Z$ in Eq. (9), choose the region $\Omega_Z$ such that it restricts the sum to surface orbitals that lie within a radius r of the tip, and that already experience a negative Zeeman field from the bulk Hamiltonian of Eq. (8). Thus, $V_Z = m_Z$ is just enough to remove the Zeeman field from these sites, and $V_Z = 2m_Z$ makes the surface-layer Zeeman field equal on both sides of the domain wall or step, as in FIG. 4(a). Then tune between these extremes by taking $V_Z \in [0, 2m_Z]$, thus modeling cases in which the magnetic tip has only partially reversed the surface field. Similarly, for $V_Z < 0$, $\Omega_Z$ is chosen such that the second term in Eq. (9) is restricted to surface orbitals experiencing a positive Zeeman field in the bulk Hamiltonian.

The region of influence of the electrostatic tip, $\Omega_G$ in Eq. (9), is defined to be a rectangle centered at $(x_0, y_0)$ relative to the QPJ and one unit cell deep, as shown by the grey shading in FIG. 4(d). A WP propagating for a distance $\ell$ along any domain-wall or step channel lying inside the quantum well defined by $\Omega_G$ acquires an additional phase proportional to $\ell \Delta k$, where $\Delta k$ is the shift of the Fermi wavevector of the channel. In the approximation of linear dispersion, $\Delta k = V_G / \hbar v_F$, where $V_G$ corresponds to a local gate voltage and $v_F$ is the Fermi velocity (equal to $v_{dw}$ and $v_{st}$ for domain-wall and step channels respectively). Thus, the off-centering of $\Omega_G$ defined by $(x_0, y_0)$ allows control of the travel distances $\ell$ along each of the four "legs" near the junction, introducing extra phases that are given by the following, as used in Eq. (7):

$$\alpha = -\Delta k_{dw} y_0, \gamma = -\Delta k_{st} x_0 \quad (10)$$

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like. It will be appreciated that the term "or" as used herein refers to a non-exclusive "or," unless otherwise indicated (e.g., use of "or else" or "or in the alternative").

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof.

What is claimed is:

1. An electronic device, comprising:
   an A-type antiferromagnetic topological insulator (AFM TI) having a surface and comprising a bulk domain wall structure supporting a 1D chiral channel between two adjacent surface layer regions that support an anomalous Hall effect of opposite sign;
   a step structure formed on the surface of the AFM TI and intersecting the bulk domain wall structure, the surface step structure supporting 1D chiral channels between surface layer and adjacent second layer regions that support an anomalous Hall effect of opposite sign;

the intersection of the bulk domain wall structure and the surface step structure providing thereat a quantum point junction (QPJ).

2. The electronic device of claim 1, wherein the antiferromagnetic topological insulator is made of candidate materials comprising any of $MnBi_2Te_4$, $MnBi_4Te_7$, $EuIn_2As_2$, and NpBi.

3. The electronic device of claim 1, wherein a wave-packet (WP) entering the electronic device along a domain wall structure channel is split into two component WPs by the QPJ, the two component WPs traveling away from the QPJ along step structure channels.

4. The electronic device of claim 1, wherein propagation of wave-packets (WPs) by the QPJ is characterized by an S-matrix associated with the QPJ, wherein manipulation of the QPJ using magnetic and electrostatic scanning tunneling microscopy (STM) tips in proximity with the QPJ changes the S-matrix characterization of the QPJ.

5. The electronic device of claim 1, wherein a plurality of quantum point junctions are provided, and the electronic device comprises an electron interferometer.

6. The electronic device of claim 1, wherein a plurality of quantum point junctions are provided, and the electronic device comprises a local magnetic sensor.

7. The electronic device of claim 1, wherein a plurality of controllable quantum point junctions are provided, and the electronic device is used to manipulate qubits in a quantum computing system.

8. The electronic device of claim 7, wherein the controllable quantum point junctions comprise quantum gates organized to perform quantum computations.

9. A method of forming an electronic device, comprising:
on a surface of an A-type antiferromagnetic topological insulator (AFM TI) comprising a bulk domain wall structure supporting a 1D chiral channel between two adjacent surface layer regions that support an anomalous Hall effect of opposite sign, forming a surface step structure intersecting the bulk domain wall structure, the surface step structure supporting 1D chiral channels between surface layer and adjacent second layer regions that support an anomalous Hall effect of opposite sign;
the intersection of the bulk domain wall structure and the surface step structure providing thereat a quantum point junction (QPJ).

10. The method of claim 9, wherein the antiferromagnetic topological insulator is made of candidate materials comprising any of $MnBi_2Te_4$, $MnBi_4Te_7$, $EuIn_2As_2$, and NpBi.

11. The method of claim 9, wherein a wave-packet (WP) entering the electronic device along a domain wall structure channel is split into two component WPs by the QPJ, the two component WPs traveling away from the QPJ along step structure channels.

12. The method of claim 9, wherein propagation of wave-packets (WPs) by the QPJ of the electronic device is characterized by an S-matrix associated with the QPJ, the method further comprising manipulation of the QPJ using magnetic and electrostatic scanning tunneling microscopy (STM) tips in proximity with the QPJ changes the S-matrix characterization of the QPJ.

13. The method of claim 9, wherein a plurality of quantum point junctions are provided, and the electronic device comprises an electron interferometer.

14. The method of claim 9, wherein a plurality of controllable quantum point junctions are provided, and the electronic device is used to manipulate qubits in a quantum computing system.

15. The electronic device of claim 7, wherein the controllable quantum point junctions comprise quantum gates organized to perform quantum computations.

16. A Mach-Zehnder electron interferometer implemented on a surface of an A-type antiferromagnetic topological insulator (AFM TI), the surface having a bulk domain wall structure supporting a 1D chiral channel between two adjacent surface layer regions that support an anomalous Hall effect of opposite sign;
a step structure formed on the surface of the AFM TI and intersecting the bulk domain wall structure, the surface step structure supporting 1D chiral channels between surface layer and adjacent second layer regions that support an anomalous Hall effect of opposite sign;
the intersection of the bulk domain wall structure and the surface step structure providing thereat a quantum point junction (QPJ).

17. The interferometer of claim 16, wherein the antiferromagnetic topological insulator is made of candidate materials comprising any of $MnBi_2Te_4$, $MnBi_4Te_7$, $EuIn_2As_2$, and NpBi.

18. The interferometer of claim 16, wherein a wave-packet (WP) entering the electronic device along a domain wall structure channel is split into two component WPs by the QPJ, the two component WPs traveling away from the QPJ along step structure channels.

19. The interferometer of claim 16, wherein propagation of wave-packets (WPs) by the QPJ is characterized by an S-matrix associated with the QPJ, wherein manipulation of the QPJ using magnetic and electrostatic scanning tunneling microscopy (STM) tips in proximity with the QPJ changes the S-matrix characterization of the QPJ.

20. The interferometer of claim 16, wherein:
a plurality of controllable quantum point junctions are provided, and the interferometer is used to manipulate qubits in a quantum computing system; and
the controllable quantum point junctions comprise quantum gates organized to perform quantum computations.

* * * * *